United States Patent [19]

Ogasahara et al.

[11] Patent Number: 5,349,460
[45] Date of Patent: Sep. 20, 1994

[54] REMOTE CONTROL SYSTEM FOR CONTROLLING A TELEVISION RECEIVER

[75] Inventors: Naokazu Ogasahara, Osaka; Hiroshi Miyai, Takarazuka, both of Japan

[73] Assignee: Matsushita Electric Industrial Co., Ltd., Osaka, Japan

[21] Appl. No.: 176,289

[22] Filed: Dec. 30, 1993

Related U.S. Application Data

[63] Continuation of Ser. No. 4,655, Jan. 14, 1993, abandoned, which is a continuation of Ser. No. 706,320, May 28, 1991, abandoned.

[30] Foreign Application Priority Data

May 28, 1990 [JP] Japan .................................. 2-137800

[51] Int. Cl.$^5$ .............................................. H04B 10/00
[52] U.S. Cl. ................................. 359/142; 359/152; 348/734; 345/157
[58] Field of Search .............................. 359/142–144, 359/146, 152, 157, 113; 250/203.3; 348/734; 345/157

[56] References Cited

U.S. PATENT DOCUMENTS

| | | | |
|---|---|---|---|
| 4,633,522 | 12/1986 | Yamamoto et al. | 359/143 |
| 4,745,402 | 5/1988 | Auerbach | 340/709 |
| 5,009,501 | 4/1991 | Fenner et al. | 250/203.3 |
| 5,045,843 | 9/1991 | Hansen | 359/142 |

OTHER PUBLICATIONS

Patent Abstracts of Japan, vol. 14, No. 229 (E-928) May 15, 1990 & JP-A-2 058 994 (Matsushita) Feb. 28, 1990 *abstract*.

*Primary Examiner*—Richard E. Chilcot, Jr.
*Assistant Examiner*—Kinfe-Michael Negash
*Attorney, Agent, or Firm*—Pollock, Vande Sande & Priddy

[57] ABSTRACT

A remote control system for controlling a television receiver or the like, which has an operating portion including a diaphragm and at least four light receiving elements. In the remote control system, light issued from an external light source is received by the light receiving elements through the diaphragm. Further, the direction in which the operating portion is oriented is detected on the basis of light receiving signals outputted, by corresponding single electrodes, from each of the light receiving elements. Furthermore, in a unit such as a to be controlled television receiver, a cursor is displayed at a position toward which the operating portion is turned on the screen of the unit. Then, the cursor is moved on the screen in response to change in the direction in which the operating portion is oriented. Subsequently, a desired operation is performed by depressing a switch of the operating portion when the cursor is superposed on an indication of the desired operation in a menu displayed on the screen. Thereby, the remote control system is easily manipulated.

11 Claims, 5 Drawing Sheets

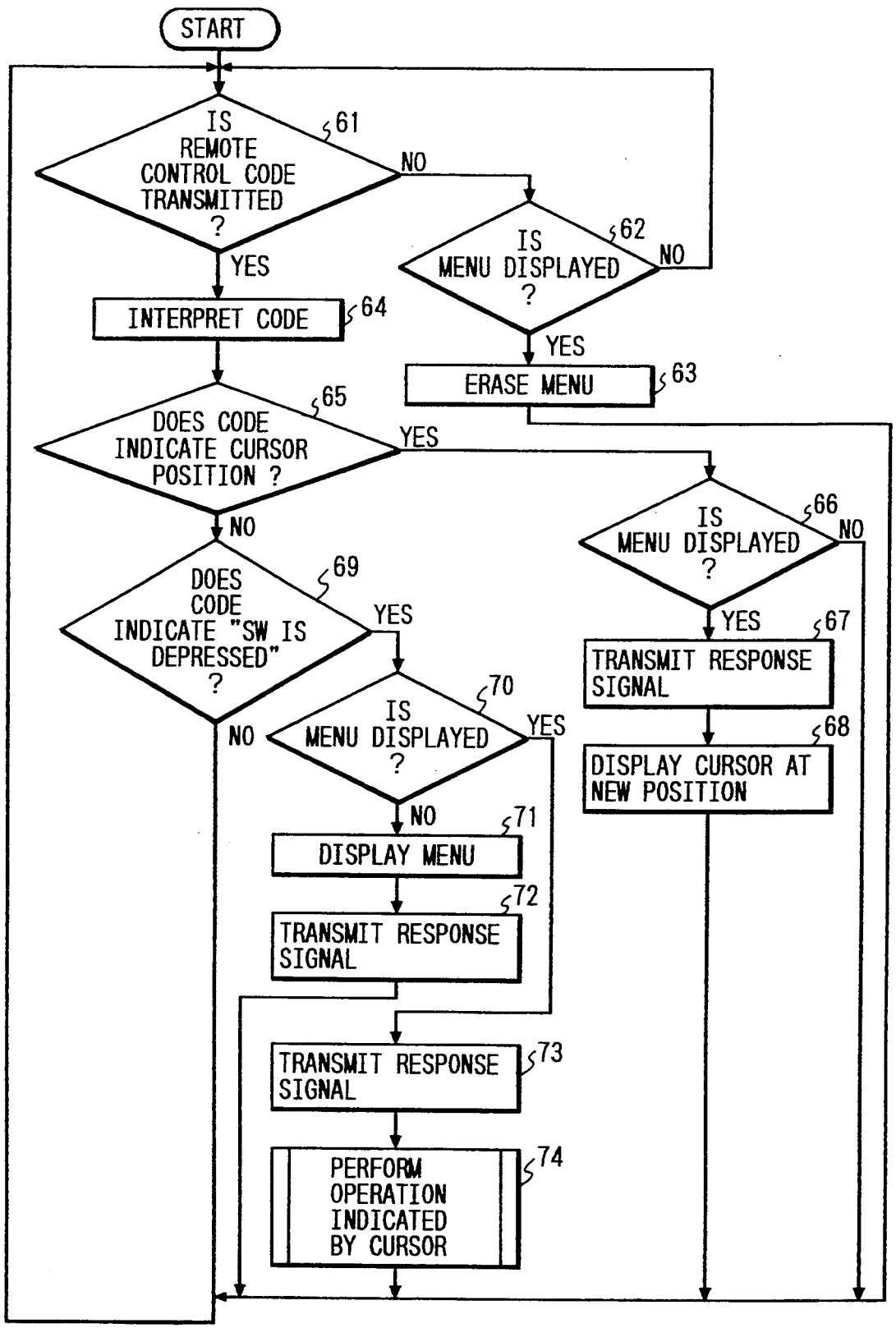

REMOTE CONTROL SYSTEM FOR CONTROLLING A TELEVISION RECEIVER

This application is a continuation of Ser. No. 08/004,655, filed on Jan. 14, 1993, now abandoned, which is a continuation of Ser. No. 07/706,320, filed on May 28, 1991, now abandoned.

BACKGROUND OF THE INVENTION

1. Field of The Invention

This invention relates to a remote control system for controlling a television receiver or the like.

2. Description of The Prior Art

In recent years, there has been a trend toward large television receivers. Moreover, projection television receivers each of which meets a demand for a very large screen and has equipment provided on the ceiling of a room for projecting an image on a screen mounted on a wall thereof instead of a cathode ray tube (CRT) have been coming into wide use.

When using the projection television receivers, it is necessary for showing a motion picture to shade a room similarly as in case of showing a picture at a movie theater (i.e., a cinema house). However, when a room is darkened, characters printed on a remote control system which are necessary for manipulating the remote control system becomes hard to read and as a result the remote control system becomes difficult to manipulate.

As a countermeasure for this, a system in which an illuminator is incorporated into a conventional remote control device is employed. However, when using this system, it is necessary for a viewer to alternately view an image projected on the screen in front and the keyboard of the remote control device on hand in every manipulation of the remote control device. Thus, in case of the conventional system, a viewer needs to frequently move his eyes between the screen and the remote control device. Additionally, the characters printed on the keyboard of the remote control device are too small and therefore are hard to read. Therefore the conventional remote control system has a drawback that the remote control device is hard to manipulate.

Furthermore, similarly as in cases of using the projection television receivers, when using direct view receivers each of which employs an ordinary CRT, a conventional remote control system for controlling each of the direct view receivers has a similar drawback arising from the fact that the remote control device be manipulated by alternately viewing an image shown on the screen and characters printed on the remote control device.

The present invention eliminates the above described drawbacks of the conventional remote control system.

It is accordingly an object of the present invention to provide a remote control system which is easier to use in comparison with the conventional remote control system.

SUMMARY OF THE INVENTION

To achieve the foregoing object and in accordance with a first aspect of the present invention, there is provided a remote control system having a remote control device which comprises a diaphragm for limiting the cross section of a beam of light incident thereon to a small area. There are also at least four light receiving elements arranged such that an area of each of the light receiving elements on which the incident light impinges would change in accordance with the angle of incidence of the incident light, for receiving the incident light passing through the diaphragm. There is further a switching circuit for selectively inputting outputs of necessary ones of the light receiving elements, an intensity-of-received-light detecting portion for detecting the intensity of light received by each of the light receiving elements from outputs of the switching circuit, and a calculating portion for calculating a ratio of the intensity of light received by one of each pair of the light receiving elements to that of the light received by the other light receiving element from the intensities of light detected by the intensity-of-received-light detecting portion.

Thus, in the remote control device of this remote control system, light coming from an external light source is received by at least four light receiving elements through the diaphragm. Then, received light signals emitted by the respective light receiving elements are carried by a corresponding single electrode to a switching circuit and are serially detected by the intensity-of-light detecting means. Further, the intensity of light received by each of the light receiving elements is measured by the intensity-of-light detecting means. Subsequently, a ratio of the intensity of light received by one of each pair of the light receiving elements to that of light received by the other of each pair thereof is calculated by the calculating means in order to indirectly detect the direction of an operating portion of the remote control device toward the light source. Thereby, the direction of the operating portion toward the light source is changed within a predetermined range of an angle. Further, by turning the operating portion toward a specific direction, a corresponding specific function or operation is indicated.

Further, in accordance with a second aspect of the present invention, there is provided a remote control system of which the construction is similar to that of the remote control system of the first aspect of the present invention except that a lens, instead of the diaphragm, is provided.

Moreover, in accordance with preferred embodiments of the present invention, there is provided a remote control system and a unit to be controlled by the remote control system including the composing elements of the remote control system according to the first or second aspect of the present invention, wherein the remote control device further comprises a remote-control-code generating means for generating a remote control code corresponding to output data of the calculating means and for outputting a signal representing the generated remote code, and a first light emitting element for emitting light representing the signal representing the remote control code generated by the remote-control-code generating means. The unit comprises a remote-control-code receiving element receives the light emitted from said first light emitting element of the remote control device. A remote-control-code interprets and discriminates the portion for interpreting and discriminating the remote control code indicated by the signal represented by the light received by the remote-control-code receiving element. A second light emitting element emits light representing a response signal to at least two of the light emitting elements of the remote control device and a light modulating means drives the second light emitting element in such a manner to modulate the intensity of light emitted from the second light emitting element.

Thus, the light emitting element is provided in the unit such as a television receiver to be controlled. The operating portion of the remote control device is turned toward the unit to be controlled. Then, the operating portion is shifted around a line drawn from the operating portion to the center of the screen of the unit to be controlled within a small range of an angle with respect to the center of the screen of the unit to be controlled. Thereafter, light is emitted from the light emitting element of the unit to be controlled. Then, similarly as in case of the remote control system of the first aspect of the present invention, the direction of the operating portion toward the light source is detected by regarding the light emitted from the light emitting element of the unit as light from the external light source. Subsequently, data indicating the detected direction is converted by the remote-control-code generating means into a remote control code. Further, a light signal representing the remote control code is transmitted by the light emitting element of the remote control device. The thus transmitted light signal is received by the remote-control-code receiving element provided in the unit to be controlled. Then, information represented by the received signal is interpreted by the remote-control-code interpreting and discriminating portion. Thereby, the direction in which the operating portion is oriented can be found by the unit to be controlled. Consequently, the representation of a specific operation displayed on the screen of the unit can be indicated by turning the operating portion toward the unit in a corresponding specific direction within a predetermined range of an angle with respect to the line drawn the center of the screen of the unit to an initial position of the operating portion of the remote control device.

Furthermore, in accordance with a third aspect of the present invention, there is provided a remote control system having a remote control device and a unit to be controlled by the remote control device. The remote control device comprises a diaphragm means for limiting the cross section of a beam of light incident thereon to a small area. A first light receiving means for receiving the incident light passing through the diaphragm means is included in the remote control device. The first light receiving means is arranged such that an area of the first light receiving means on which the incident light impinges changes depending on an angle of incidence of the incident light. There is also an intensity-of-received-light detecting means for detecting the intensity of light received by the first light receiving means, a position-information generating means for generating position information indicating what position of the unit the remote control device is turned toward from the intensities of light detected by the intensity-of-received-light detecting means, a remote-control-code generating means for generating a remote control code corresponding to output data of the position-information generating means and for outputting a signal representing the generated remote code, and a first light emitting element for emitting light representing the signal representing the remote control code generated by the remote-control-code generating means. The unit comprises a second light receiving element for receiving the light emitted from the first light emitting element of the remote control device and a remote-control-code interpreting and discriminating means for interpreting and discriminating the remote control code indicated by the signal represented by the light received by the second light receiving element.

Further, in accordance with a fourth aspect of the present invention, there is provided a remote control system of which the construction is similar to that of the remote control system of the third aspect of the present invention except that a lens means is provided instead of the diaphragm means.

Moreover, in accordance with preferred embodiments there is provided a remote control system including the composing elements of the remote control system according to the third or fourth aspect of the present invention, wherein the first light receiving means comprises at least two light receiving elements arranged such that an area, on which the incident light impinges, of each of the light receiving elements changes depending on an angle of incidence of the incident light.

As described above, in case of the remote control system of the present invention, a cursor is first displayed on the screen of the unit such as a television receiver in the direction in which an operating portion of the remote control device is oriented. Then, the cursor can be moved on the screen by shifting the operating portion of the remote control device. Subsequently, a desired operation is selected and performed by depressing a switch provided on the operating portion when the cursor is superposed on the indication of the desired operation on the menu. Thereby, the remote control device of the present invention can be manipulated without seeing the keyboard of the remote control device. Thus, the movement of a viewer's eyes at the time of manipulating the remote control device can be decreased. Consequently, the remote control device can be very easy to manipulate. Moreover, the operability of the remote control device in the dark can be improved. Thus, the remote control system of the present invention is very advantageous to practical use.

Furthermore, in accordance with a fifth aspect of the present invention, there is provided a method of performing remote control of a unit by manipulating a remote control device, comprising the steps of turning the light emitting element of the remote control device toward the screen of the unit, transmitting a first light signal indicating the start of a remote control operation from a first light emitting element of the remote control device to the unit, displaying a menu of items of operations on the screen of the unit, transmitting a response light signal from the second light emitting element of the unit to the remote control device, generating a control code corresponding to a position on which the light emitted from the first light emitting element of the remote control device currently impinges on the screen based on the intensities of light respectively received by light receiving elements of the remote control device, transmitting a second light signal representing the generated code from the first light emitting element of the remote control device to the unit, displaying a cursor at the position corresponding to the control code represented by the second light signal on the screen of the unit, shifting the remote control device, and repeating the process from the step of transmitting a response light signal to the step of displaying the cursor on the screen of said unit if the cursor is not displayed in a region corresponding to the indication of a desired item of operations on the screen of the unit and transmitting the first light signal from the first light emitting element of the remote control device to the unit so as to perform an operation of the desired item if the cursor is displayed in the region corresponding to the indication of the desired item of operations on the screen of the unit.

BRIEF DESCRIPTION OF THE DRAWINGS

Other features, objects and advantages of the present invention will become apparent from the following description of a preferred embodiment with reference to the drawings in which like reference characters designate like or corresponding parts throughout several views, and in which:

FIG. 5 is a flowchart of a program for performing an operation of the television receiver of FIG. 3(A).

DETAILED DESCRIPTION OF THE PREFERRED EMBODIMENT

Hereinafter, a preferred embodiment of the present invention will be described in detail by referring to the accompanying drawings.

Figure 1:
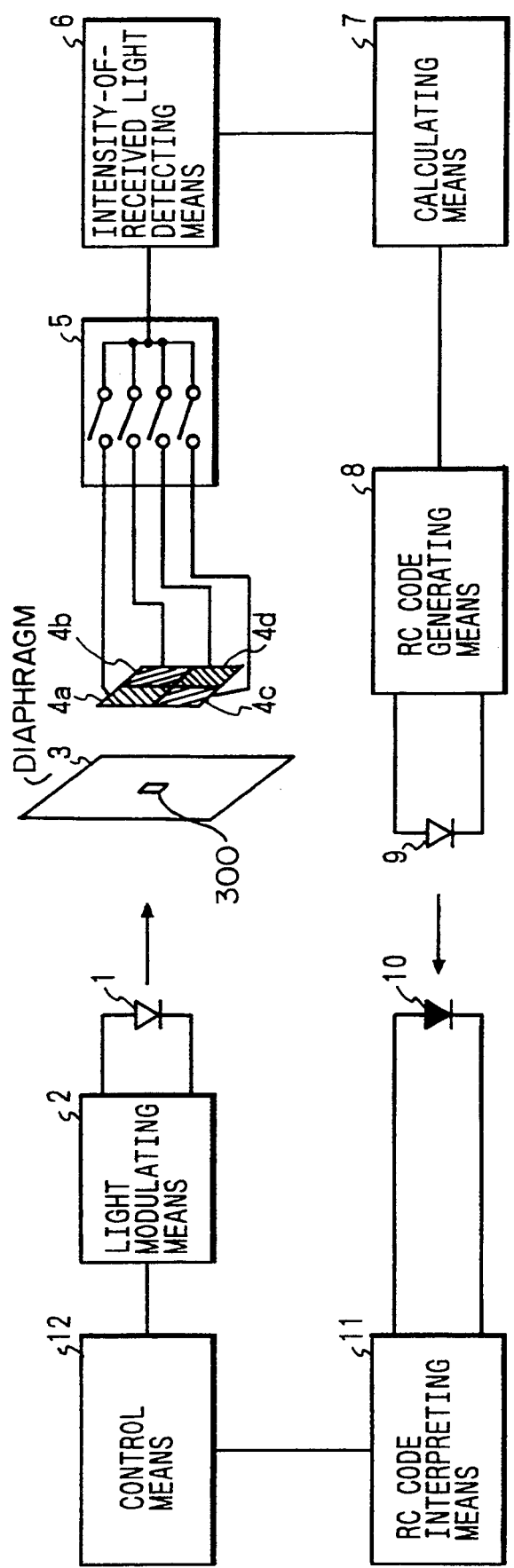
FIG. 1 is a schematic block diagram for illustrating the construction of a remote control device embodying the present invention.

Referring first to FIG. 1, there is shown the construction of the embodiment of the present invention. In this figure, reference numeral 1 designates an infrared light emitting diode (LED); and 2 a light modulating means for driving the LED 1 by applying an amplitude modulation signal having a frequency of 445 kHz thereto. These devices, together with a light receiving element 10, a remote control code interpreting means 11 and a control means 12 which will be described later, are provided in a unit to be controlled (e.g., a television receiver).

Further, a portion composed of elements from a diaphragm or stop 3 to a light emitting element 9 is provided in an operating part of a remote control device. Incidentally, the diaphragm 3 is constructed such that only a very-small-area portion 300 transmits light emitted from the LED 1. Reference numerals 4a to 4d denote light receiving elements which are positioned just posterior to the diaphragm 3. As shown in FIG. 1, this embodiment employs a combination of the four light receiving elements which are respectively arranged like a checker pattern and have large light-receiving-areas.

Reference numeral 5 represents a switching circuit, to which output signals of the four light receiving elements are connected, for selecting one or more light receiving elements from the four elements 4a to 4d and sending light receiving signals outputted from the selected elements to the next stage; 6 an intensity-of-received-light determining means (hereunder referred to simply as an intensity determining means) connected to outputs of the switching circuit 5 for quantitatively determining the intensity of light received by the light receiving elements; 7 a processing means for processing outputs of the intensity determining means 6; 8 a remote-control-code generating means (hereunder referred to simply as a code generating means) for generating a remote control code in accordance with results of operations performed by the processing means 7; 9 an infrared LED which is driven in accordance with outputs of the code generating means 8; 10 the light receiving element for receiving a light signal from the LED 9; 11 the remote control interpreting means for interpreting a remote control code represented by the signal received by the light emitting element 10; and 12 the control means for performing general control of the light modulating means 2 and the remote control code interpreting means 11.

Figure 2:
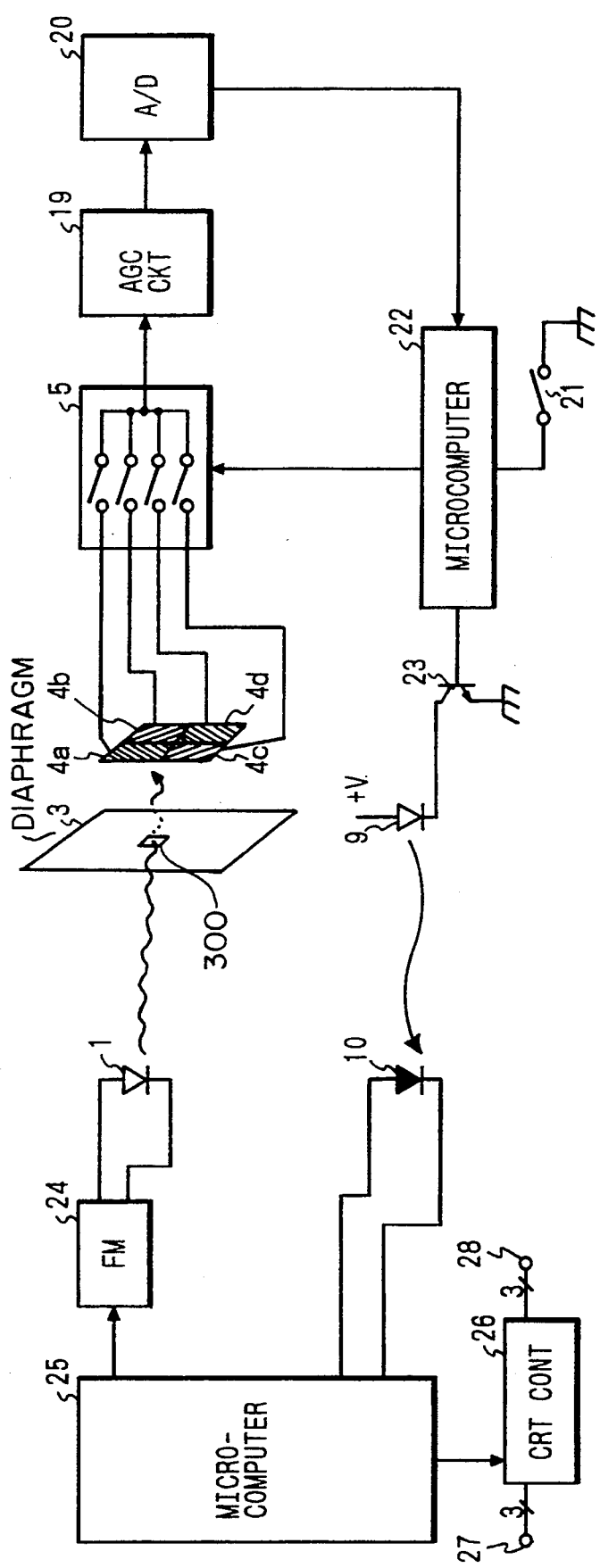
FIG. 2 is a schematic block diagram for illustrating the construction of a primary part of the remote control device of FIG. 1.

Referring next to FIG. 2, there is shown a practical example of the circuit of a primary part of the embodiment of FIG. 1. As is understood from a comparison of FIG. 2 with FIG. 1, the processing means 7 and the code generating means 8 are constructed by a microcomputer 22 and on the other hand the remote control interpreting means 11 and the control means are constructed by a microcomputer 25. The microcomputers 22 and 25 are one-chip microcomputers each of which includes a central processing unit (CPU), a read-only memory (ROM), a random access memory (RAM) and an input-output (I/O) unit. Further, reference numeral 26 denotes a CRT controller for showing characters on the screen of a CRT; 27 an RGB video input terminal from which an RGB signal converted by a signal processing circuit (not shown) by using a composite video signal; and an RGB video output terminal from which a signal obtained by the CRT controller 26 by superposing another signal representing character or the like upon the RGB signal.

In the circuit of the unit to be controlled, a frequency modulating device 24 drives the LED 1 and sends a modulated light signal to the operating portion. Further, a signal issued by the light emitting element 9 is received by the light receiving element 10 and a remote control mode represented by the received signal is read by the microcomputer 25. These operations are controlled by the microcomputer 25 in accordance with a predetermined procedure.

On the other hand, in the operating portion, the diaphragm 3 is positioned immediately prior to the light receiving element 4a to 4d. When the operating portion into which the diaphragm 3 and the light receiving elements 4a to 4d are integrally incorporated is placed face to face with the LED 1 at an initial position apart therefrom by several meters, light emitted from the LED 1 impinges on the central portion of a group of the light receiving elements 4a to 4d through the diaphragm 3. If the entire operating portion is then shifted upwardly and downwardly, and leftwardly and rightwardly within a range of from −30 degrees or so to +30 degrees or so with respect to the direction from the LED 1 to the original position thereof, the relative direction in which light comes from the LED 1 to the operating portion changes. Thus the position, on which light from the LED 1 impinges moves on the surface of the light receiving elements 4a to 4d. This results in a change of the ratio of the quantity of light received by each of the four light receiving elements 4a to 4d to that received by another one of the elements 4a to 4d.

Subsequently, it is necessary that one or more outputs of the light receiving elements 4a to 4d are selected by using the switching circuit 5. Thus, the light signals received by the light receiving elements 4a to 4d of which the outputs are selected by the circuit 5 are serially converted into digital data by an analog-to-digital (A/D) converter 20. Incidentally, an automatic gain control circuit 19 is inserted prior to the A/D converter 20 in order to compensate change of the intensity of the received light, which is caused by change in distance between the operating portion and the unit to be controlled. Then, the digital data sequentially being outputted by the A/D converter 20 and representing the intensity of the light received by each of the selected light receiving elements are read by the microcomputer 22. Based on the thus read digital data, a ratio of the intensity of light received by each of the four light receiving elements to that of light received by another one of the light receiving elements is calculated. Thereby, it can be found how many degrees the operating portion is oriented away from the direction of the original position thereof from the LED 1 within the range of from −30 degrees to +30 degrees. Reference numeral 21 represents a switch, to which the microcomputer 22 is connected for determining whether or not the switch 21 is pressed down, for directing that a remote control operation is started and for selecting an item of the remote control operation.

Information on the direction of the operating portion is generated by the microcomputer 22 as a remote control code. In response to a signal representing the generated remote control code which is outputted by the microcomputer 22, a transistor 23 drives the light emitting element 9 and causes an electric current flow therein, thereby performing a transmission of a signal representing the information on the direction of the operating portion (namely, the remote control code) by using light.

The transmitted light representing the information on the direction of the operating portion is received by the light receiving element 10 provided in the unit to be controlled. Then, a signal outputted from the light receiving element 10 is connected to the microcomputer 25 which interprets the transmitted remote control code, thereby finding the direction of the operating portion. The CRT controller 28 displays a menu which is a list of operation functions such as a picture quality regulation and a sound regulation on the screen of the television receiver as well as a cursor thereon based on the signal transmitted from the operating portion and representing the direction of the operating portion.

Figure 3A:
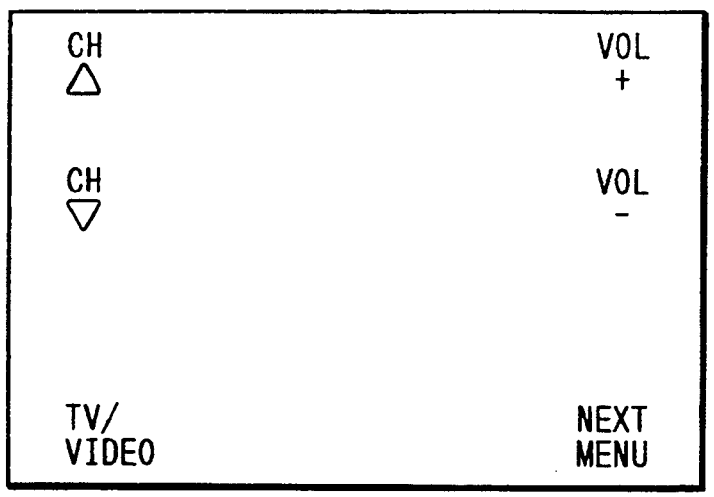
FIG. 3(A) is a diagram for illustrating an image displayed on the screen of a television receiver to be controlled by the remote control device of FIG. 1.
Figure 3B:
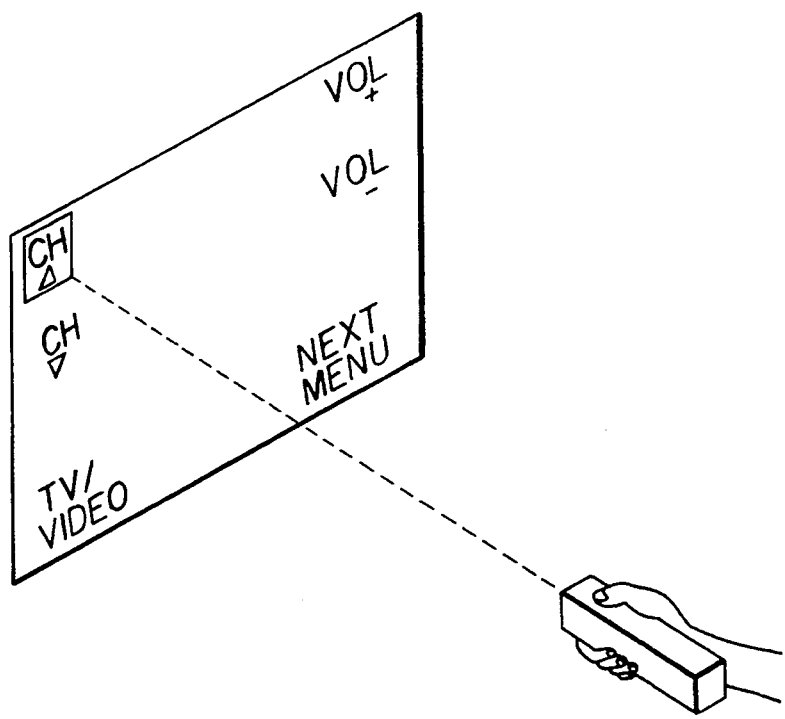
FIG. 3(B) is a diagram for illustrating an operation menu and a cursor displayed on the screen of the television receiver of FIG. 3(A)

Referring next to FIGS. 3(A) and 3(B), there are respectively shown an example of an image practically displayed on the screen of the television receiver and another example of an image displayed thereon when the direction of the operating portion is changed. FIG. 3(A) illustrates an image displayed on the screen of the television receiver corresponding to the unit to be controlled. First, by first depressing the switch 21 of the operating portion, an operation menu of FIG. 3(A) is displayed by being superimposed on an ordinary picture. When the direction of the operating portion is changed, the information on the direction of the operating portion to be transmitted to the unit to be controlled is also changed. At that time, the operation menu as well as a cursor is displayed on the screen as illustrated in FIG. 3(B). When the transmitted signal representing the direction of the operating portion varies, the position of the cursor is changed such that the cursor is always displayed at a position, which is placed in the direction of the operating portion, on the screen. Thereby, a viewer manipulating the operating portion can feel that when the operating portion is appropriately shifted toward the screen of the television receiver, the cursor moves on the screen in response to the shift of the operating portion. Moreover, it can be realized that a function of selecting a desired item of an operation by depressing the switch 21 again with the cursor put on the indication of the desired item of an operation on the screen is added to the remote control device.

Next, an operation of the remote control device constructed as described above will be described hereinbelow by referring to a flowchart of FIG. 4.

Figure 4:
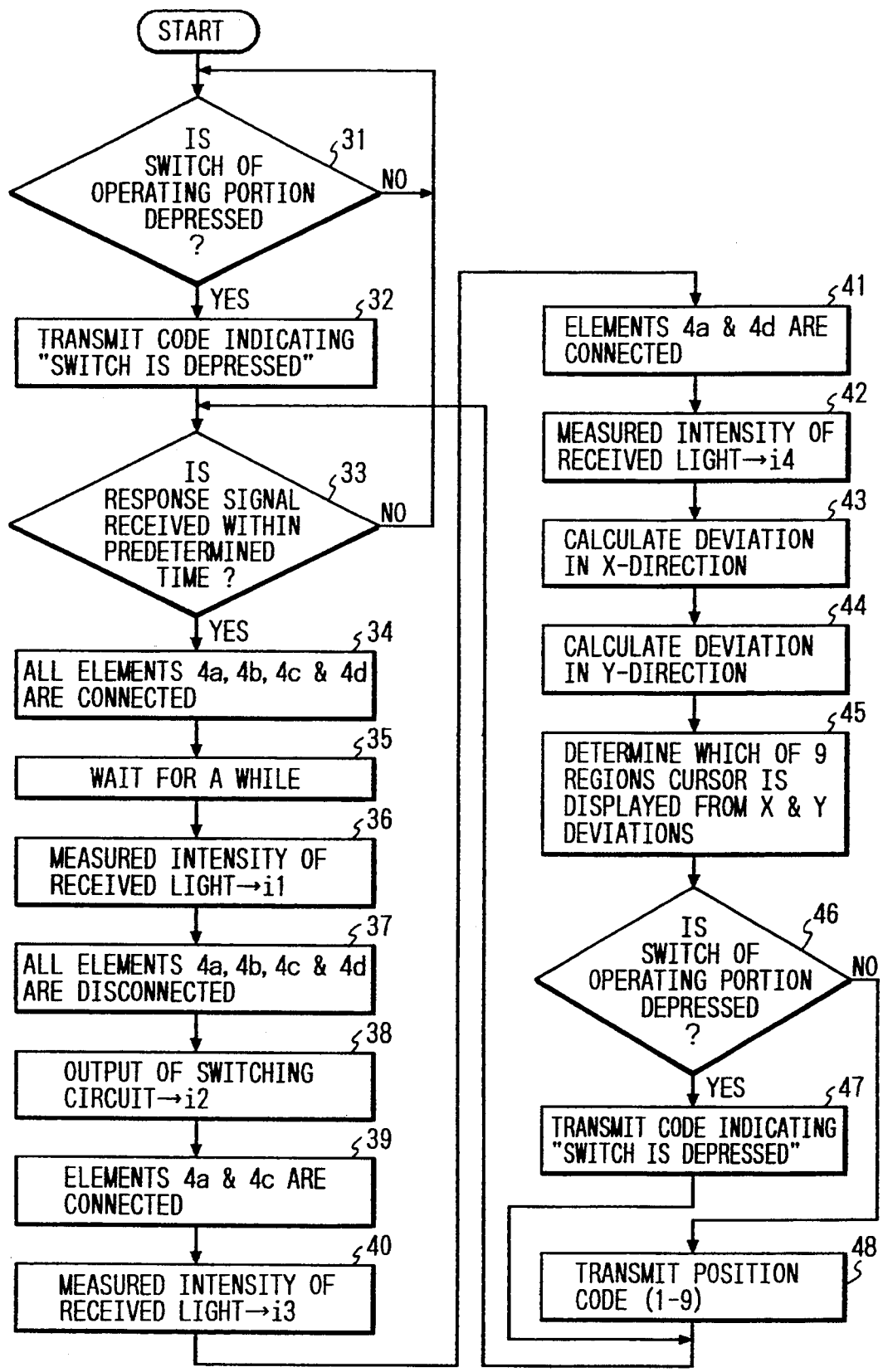
FIG. 4 is a flowchart of a program for performing an operation of an operating portion of the remote control device of FIG. 1.

Referring now to FIG. 4, there is illustrated a flowchart of a program for performing an operation of the microcomputer 22 provided in the operation portion of the remote control device.

When the operating portion is not used, a state of the switch 21 of the operating portion is detected in step 31 and the remote control device is placed in the wait state in this step until the switch 21 is depressed.

When the switch 21 of the operating portion is pressed down, the program advances to step 32 whereupon a remote control code indicating that the switch is depressed is transmitted once to the unit to be controlled. The unit to be controlled is adapted to transmit to the operating portion a sequence of pulses for a predetermined time as a response signal. An operation of the unit to be controlled will be described in detail later. The predetermined time is set to be equal to or longer than the time required for performing processing in steps 34 to 46 which will be described later.

Next, in step 55, the operating portion of the remote control device waits for a response signal in order to determine whether or not the response signal is received within another predetermined period of time. In the case in which the operating portion cannot receive a response signal transmitted from the unit to be controlled within the predetermined period of time, the program returns to the step 31 so that the remote control device falls into the wait state once more. This is to prevent current drain of a battery provided in the remote control device in a meaningless case, for instance, in the case in which the switch of the operating portion is depressed when the operating portion does not face the unit to be controlled. In contrast, in the case in which the operating portion receives a response signal transmitted from the unit to be controlled, the program advances to step 34.

In step 34, first, the switching circuit 5 is set in such a manner that outputs of all of the light receiving elements 4a, 4b, 4c and 4d are connected to the A/D converter 20. Then, the remote control device is placed in the wait state for a while in step 35 until an operation of the automatic gain control circuit 19 becomes stable. Subsequently, in step 36, the intensity of light received by the light receiving elements is measured. Namely, output data of the A/D converter 20 is read by the microcomputer 22 and is further held therein as data i1.

Next, in step 37, the switching circuit 5 is set in such a fashion that the outputs of all of the light receiving elements 4a, 4b, 4c and 4d are separated from the A/D converter 20. Then, in step 38, output data of the A/D converter 22 is read by the microcomputer 22 and is held therein as data i2 which indicates a quantity of noises generated in the automatic gain control circuit 19 when the gain of the operating portion is appropriately regulated for the measured intensity of light and is later used for performing an operation.

Next, for the purpose of examining which of the light receiving elements 4a to 4d receives the light issued from the LED 1, the switching circuit 5 is set in step 39 in such a manner to connect only outputs of the light receiving elements 4a and 4c to the A/D converter 20 and subsequently the intensity of light is measured in step 40 similarly as in step 36. The result of the measurement is stored in the microcomputer 22 as data i3.

Similarly, the switching circuit 5 is set in step 41 in such a manner to connect only outputs of the light receiving elements 4a and 4d to the A/D converter 20 and subsequently the intensity of light is measured in step 42. The result of this measurement is stored in the microcomputer 22 as data i4.

A deviation x of the direction of the operation in the x-direction is calculated in step 43 by using the following equation from the data i1 to i4 measured as described above:

$$x=(i3-i2)\times 16/(i1-i2)$$

Next, a deviation y of the direction of the operating operation in the y-direction is similarly calculated in step 44 by using the following equation:

$$y=(i4-i2)\times 16/(i1-i2)$$

Incidentally, with relation to each of the deviations x and y, a part after the decimal point is discarded. By using the above described equations, the deviations in the x-direction and y-direction are represented by numbers 0 to 15, respectively. Next, in step 45, which of the $3\times 3$ regions obtained is determined by dividing by 3 each of height and width of the screen the operating portion is turned toward. To this end, the program preliminarily contains a correspondence table indicating the corresponding relation between values of the deviation x and three columns (namely, a left, center and right columns) each composed of three regions. In this embodiment, the corresponding relation therebetween is preliminarily determined as follows:

(1) If the value of the deviation x is in a closed interval from 0 to 3, the operating portion is turned toward one of the regions of the left column;

(2) If the value of the deviation x is in a closed interval from 4 to 11, the operating portion is turned toward one of the regions of the center column; and (3) If the value of the deviation x is in a closed interval from 12 to 15, the operating portion is turned toward one of the regions of the right column.

Thus, by referring to this correspondence table, it is first judged from the value (0-15) of the deviation x which of the three columns on the screen of the television receiver the operating portion is turned toward. Similarly, the program preliminarily contains a correspondence table indicating the corresponding relation between values of the deviation y and three rows (namely, a top, center and bottom rows) each composed of three regions. Further, by referring to this table, it is then determined from the value (0-15) of the deviation y which of the three rows on the screen of the television receiver the operating portion is turned toward.

Next, in step 46, it is judged again whether or not the switch 21 of the operating portion is depressed. Incidentally, in the case in which the switch is kept depressed, since it is judged in step 31 that the switch is depressed, it is regarded in step 46 that the switch is not depressed. Only in the case in which the switch is depressed again after the switch is turned off, it is regarded in step 46 that the switch is depressed.

In the case in which the switch 21 is not depressed, the program advances to step 48. In this embodiment, a remote control code is preliminarily assigned to each of the nine regions previously described. Namely, nine remote control codes respectively indicating the nine regions are preliminarily determined. In step 48, a remote control code indicating one of the regions is transmitted to the unit to be controlled. In contrast, in the case in which the switch is depressed, the program advances to step 47 whereupon a remote control code indicating that the switch is depressed is transmitted once to the unit to be controlled. After transmitting this code, the program returns to step 33 whereupon the operating portion waits for a response signal transmitted in response to this code by the unit to be controlled. Thereafter, the above described operations to be performed in a loop comprised of steps 33 to 48 are repeatedly affected.

Referring next to FIG. 5, there is illustrated a flowchart of a program for performing an operation of the microcomputer 25 of the unit to be controlled.

First, it is checked in step 61 whether or not a remote control code is presently received. If no remote control code is received, the program advances to step 62 whereupon it is checked whether or not the menu is presently displayed. If the menu is not displayed, it is regarded that the unit to be controlled is in an ordinary wait state. Further, the program returns to step 61 and thus the unit to be controlled waits again for a reception of a remote control code. In contrast, if the menu is displayed, the program advances to step 63 whereupon the menu is erased from the screen. Then, the program returns to step 61 and the unit to be controlled falls into the wait state again. As long as the operating portion is turned toward the screen of the television receiver, the operating portion and the unit to be controlled keep performing the transmission of the remote control codes and the response to the received remote control codes, respectively. Therefore, interruption of transmission of remote control codes can be regarded that the operating portion of the remote control device is not turned toward the unit to be controlled and that namely, a viewer stops controlling the unit to be controlled.

In the case in which it is found in step 61 that a remote control code is received, the program advances to step 64 whereupon the contents of the received remote control code are interpreted. Subsequently, in step 65, it is checked whether or not the received remote control code indicates one of the regions in which the cursor is displayed. If the received remote control code indicates one of the regions, the program advances to step 66 whereupon the menu is presently displayed. If not displayed, the program returns to step 61 because information on the region in which the cursor is displayed is useless when the menu is not displayed on the screen. In contrast, if the menu is displayed, a signal frequency-modulated by using a constant frequency is first transmitted for a predetermined time toward the operating portion in step 67. Then, the cursor is actually displayed in the region indicated by the received remote control code in step 68. Thereafter, the program returns to step 61 and the remote control device waits for the next remote control code.

In the case in which it is found in step 65 that the received remote control code does not indicate the position at which the cursor is displayed, the program advances to step 69 whereupon it is checked whether or not the received remote control code is a code (hereunder referred to as a switch-depressing code) indicating that the switch is depressed. If the received remote control code is the switch-depressing code, the program advances to step 70 whereupon the menu is presently displayed on the screen. If the menu is not displayed on the screen, the program advances to step 71. In the case in which the switch-depressing code is received when the menu is not displayed, an operation of displaying the menu is performed in response to this code. Thus, in step 71, the menu is displayed. Subsequently, in step 72, a response signal is transmitted to the operating portion. Then, the program returns to step 61, so that the remote control device falls into the wait state. In the case in which the switch-depressing code is received when the menu is displayed, this code means that a command indicated at the position at which the cursor is presently displayed in the menu is performed. In step 73, a response signal is transmitted to the operating portion. Then, a command indicated at the position at which the cursor is presently displayed in the menu is performed in step 74. Thereafter, the program returns to step 61 and thus the remote control device falls into the wait state.

With the arrangement of the above described embodiment, in case of applying the present invention to a television receiver, a viewer can select a desired item of operations by first turning the operating portion itself toward the item of the menu displayed on the television receiver and next depressing the switch 21 of the operating portion. Thus, in case of using the remote control device of the present invention, a selection of an item of operations is straightforward and therefore the remote control device according to the present invention is easy to manipulate. Moreover, the remote control device of the present invention can be manipulated without seeing the keyboard of the remote control device and namely can be easily manipulated even in the dark.

While a preferred embodiment of the present invention has been described above, it is to be understood that the present invention is not limited thereto and that other modifications will be apparent to those skilled in the art without departing from the spirit of the invention. The scope of the present invention, therefore, is to be determined solely by the appended claims.

What is claimed is:

1. A remote control system having a remote control device and a unit to be controlled by said remote control device, said remote control device comprising:

a diaphragm means for limiting the cross section of a beam of light incident thereon to a small area;

at least four light receiving elements for receiving the incident light passing through said diaphragm, each of the light receiving elements having a single electrode connected thereto;

said light receiving elements being arranged such that an area of each of said light receiving elements on which the incident light impinges changes depending on the angle of incidence of the incident light;

switching circuits each connected to a corresponding one of said light receiving elements for inputting an output signal of said corresponding one of said light receiving elements;

an intensity-of-received-light detecting means connected to the outputs of the switching circuits for determining from the outputs from said switching circuits the intensity of light received by said light receiving means, each of the switching circuits connecting and disconnecting the output signal of said corresponding one of said light receiving elements to said intensity-of-received-light detecting means;

a calculating means connected to the output of the intensity-of-received-light detecting means for calculating, from the intensities of light detected by said intensity-of-received-light detecting means, a ratio of the intensity of light received by one of said light receiving elements to that of light received by another light receiving element.

2. A remote control system having a remote control device and a unit to be controlled by said remote control device, said remote control device comprising:

a lens means for limiting the cross section of a beam of light incident thereon to a small area;

at least four light receiving elements for receiving the incident light passing through said lens, each of the light receiving elements having a single electrode connected thereto;

said light receiving elements being arranged such that an area of each of said light receiving elements, on which the incident light impinges, changes depending on the angle of incidence of the incident light;

switching circuits each connected to a corresponding one of said light receiving elements for inputting outputs of a corresponding one of said light receiving elements;

an intensity-of-received-light detecting means connected to the outputs of the switching circuits for determining from the outputs of said switching circuits the intensity of light received by each of said light receiving means, each of the switching circuits connecting and disconnecting the output signal of said corresponding one of said light receiving elements to said intensity-of-received-light detecting means;

a calculating means connected to the output of the intensity-of-received-light detecting means for calculating, form the intensities of light detected by said intensity-of-received-light detecting means, a ratio of the intensity of light received by one of said light receiving elements to that of light received by another light receiving element.

3. A remote control system as set froth in claim 1 or 2 wherein said remote control device further comprises:

a remote-control-code generating means connected to the output of the calculating means for generating a remote control code corresponding to output data of said calculating means and for outputting a signal representing the generated remote code; and a first light emitting element for emitting light representing the remote control code generated by said remote-control-code generating means, wherein each unit includes:

a remote-control-code receiving element for receiving the light emitted from said first light emitting element of said remote control device;

a remote-control-code interpreting and discriminating means connected to the output of the remote-control-code-receiving element for interpreting and discriminating the remote control code as represented by the light received by said remote-control-code receiving element;

a second light emitting element for emitting light representing a response signal to at least four of the light receiving elements of said remote control device; and a light modulating means for driving said second light emitting element to modulate the intensity of light emitted from said second light emitting element.

4. A remote control system having a remote control device and a unit to be controlled by said remote control device, said remote control device comprising:
   a diaphragm means for limiting the cross section of a beam of light incident thereon to a small area;
   at least four light receiving elements for receiving the incident light passing through said diaphragm, each of the light receiving elements having a single electrode connected thereto;
   said light receiving elements being arranged such that an area of each of said light receiving elements, on which the incident light impinges, changes depending on the angle of incidence of the incident light;
   an intensity-of-received-light detecting means for detecting the intensity of light received by said light receiving elements;
   a position-information generating means for generating position information indicating what position of said unit said remote control device is turned toward from the intensities of light detected by said intensity-of-received-light detecting means;
   a remote-control-code generating means for generating a remote control code corresponding to output data of said position-information generating means, and for outputting a signal representing the generated remote code; and
   a light emitting element for emitting light representing the remote control code generated by said remote-control-code generating means, and wherein said unit includes:
   a light receiving element for receiving the light emitted from said light emitting element of said remote control device; and
   a remote-control-code interpreting and discriminating means for interpreting and discriminating the remote control code as represented by the light received by said light receiving element.

5. A remote control code system having a remote control device and a unit to be controlled by said remote control device, said remote control device comprising:
   a lens means for limiting the cross section of a beam of light incident thereon to a small area;
   at least four light receiving elements for receiving the incident light passing through said diaphragm, said light receiving elements being arranged such that an area of each of said light receiving elements, on which the incident light impinges, changes depending on the angle of incidence of the incident light;
   each of the light receiving elements having a single electrode connected thereto;
   an intensity-of-received-light detecting means connected to the electrodes for detecting the intensity of light received by said light receiving elements;
   a position-information generating means for generating position information indicating what position of said unit said remote control device is turned toward from the intensities of light detected by said intensity-of-received-light detecting means;
   a remote-control-code generating means for generating a remote control code corresponding to output data of said position-information generating means, and for outputting a signal representing the generated remote code; and
   a light emitting element for emitting light representing the remote control code generated by said remote-control-code generating means, and wherein said unit comprises:
   a light receiving element for receiving the light emitted from said light emitting element of said remote control device; and
   a remote-control-code interpreting and discriminating means for interpreting and discriminating the remote control code as represented by the light received by said light receiving element.

6. In a system having a remote control device and a unit to be controlled by said remote control device, said remote control device including a first light emitting element for transmitting light signals to said unit, each of the light receiving elements having a single electrode connected thereto:
   and also including at least four light receiving elements for receiving light transmitted from said unit, switching circuits each connected to a corresponding one of said light receiving elements for inputting an output signal of said corresponding one of said light receiving elements, an automatic gain control circuit for compensating change of outputs from said switching circuits, which is caused by change in distance between the remote control device and the unit, and for outputting a first signal representing a result of compensation, each of the switching circuits connecting and disconnecting the output signal of said corresponding one of said light receiving elements to said automatic gain control circuit, said automatic gain control circuit outputting a second signal representing a quantity of noises generated therein when said switching circuits input no outputs of said light receiving elements, an intensity-of-received-light detecting means for detecting the intensity of light received by each of said light receiving elements from the first signal output by said automatic gain control circuit and for detecting correction data from the second signal output from said automatic gain control circuit, said unit including a second light emitting element, a method of performing remote control of said unit by manipulating said remote control device, comprising the steps of:
   turning said light emitting element of said remote control device toward the screen of said unit;
   transmitting a first light signal indicating the start of a remote control operation from the first light emitting element of said remote control device to said unit;
   displaying a menu of items of operations on the screen of said unit;
   transmitting a response light signal from said second light emitting element of said unit to said remote control device;
   detecting the intensity of light received by all of said light receiving elements by connecting said switching circuits to all of said light receiving means;
   detecting the correction data by separating said switching circuits from all of said light receiving means;
   detecting the intensity of light received by each pair of said light receiving means, which are selectively connected to said switching circuits;
   generating a control code corresponding to a position on which the light emitted from said first light emitting element of said remote control device currently impinges, on the screen, based on the intensities of light and the correction data respectively detected by said intensity-of-received-light detecting means of said remote control device;

transmitting a second light signal representing the generated code from said first light emitting element of said remote control device to said unit;

displaying a cursor at the position corresponding to the control code represented by the second light signal on the screen of said unit;

shifting said remote control device and repeating the process from the step of transmitting a response light signal to the step of displaying the cursor on the screen of said unit if the cursor is not displayed in a region corresponding to the indication of a desired item of operations on the screen of said unit; and transmitting the first light signal from said first light emitting element of said remote control device to said unit so as to perform an operation of the desired item if the cursor is displayed in the region corresponding to the indication of the desired item of operations on the screen of said unit.

7. A remote control system having a remote control device and a unit to be controlled by said remote control device, said remote control device comprising:

a diaphragm for limiting the cross section of a beam of light incident thereon to a small area;

at least three light receiving elements for receiving the incident light passing through said diaphragm, said light receiving elements being arranged such that an area, on which the incident light impinges, of each of said light receiving elements changes depending on an angle of incidence of the incident light;

a switching circuit for receiving outputs of selected necessary ones of said light receiving elements and outputting the received outputs of the selected necessary ones of said light receiving elements;

an automatic gain control circuit for compensating change of outputs of said switching circuit, which is caused by change in distance between the remote control device and the unit, and for outputting a first signal representing a result of compensation, said automatic gain control circuit outputting a second signal, which represents a quantity of noises generated therein, when said switching circuit receives no outputs of said light receiving elements;

an intensity-of-received-light detecting means for detecting the intensity of light received by each of said light receiving elements from the first signal output by said automatic gain control circuit and for detecting correction data from the second signal output from said automatic gain control circuit; and a calculating means for calculating a ratio of difference between the intensity of light, which is received by one of each pair of said light receiving elements and detected by said intensity-of-received-light detecting means, and the correction data to that of a difference between the light by the other light receiving element from the intensities of light detected by said intensity-of-received-light detecting means and the correction data.

8. A remote control system having a remote control device and a unit to be controlled by said remote control device, said remote control device comprising:

a lens means for limiting the cross section of a beam of light incident thereon to a small area;

at least three light receiving elements for receiving the incident light passing through said lens means, said light receiving elements being arranged such that an area, on which the incident light impinges, of each of said light receiving elements changes depending on an angle of incidence of the incident light;

a switching circuit for receiving outputs of selected necessary ones of said light receiving elements and outputting the received outputs of the selected necessary ones of said light receiving elements;

an automatic gain control circuit for compensating change of outputs of said switching circuit, which is caused by change in distance between the remote control device and the unit, and for outputting a first signal representing a result of compensation, said automatic gain control circuit outputting a second signal, which represents a quantity of noises generated therein, when said switching circuit receives no outputs of said light receiving elements;

an intensity-of-received-light detecting means for detecting the intensity of light received by each of said light receiving elements from the first signal output by said automatic gain control circuit and for detecting correction data from the second signal output from said automatic gain control circuit; and a calculating means for calculating a ratio of a difference between the intensity of light, which is received by one of each pair of said light receiving elements and detected by said intensity-of-received-light detecting means, and the correction data to that of a difference between the light by the other light receiving element from the intensities of light detected by said intensity-of-received-light detecting means and the correction data.

9. A remote control system as set forth in claim 7 or 8, wherein said remote control device further comprises:

a remote-control-code generating means for generating a remote control code corresponding to output data of said calculating means and for outputting a signal representing the generated remote code;

a first light emitting element for emitting light designating the signal representing the remote control code generated by said remote-control-code generating means, wherein said unit includes:

a remote-control-code receiving element for receiving the light emitted from said first light emitting element of said remote control device;

a remote-control-code interpreting and discriminating means for interpreting and discriminating the remote control code as represented by the light received by said remote-control-code receiving element;

a second light emitting element for emitting light representing a response signal to at least two of the light emitting elements of said remote control device; and a light modulating means for driving said second light emitting element in such a manner to modulate the intensity of light emitted from said second light emitting element.

10. A remote control system having a remote control device and a unit to be controlled by said remote control device, said remote control device comprising:

a diaphragm for limiting the cross section of a beam of light incident thereon to a small area;

at least three light receiving elements for receiving the incident light passing through said diaphragm, said light receiving elements being arranged such that an area, on which the incident light impinges, of each of said light receiving elements changes depending on an angle of incidence of the incident light;

a switching circuit for receiving outputs of selected necessary ones of said light receiving elements and outputting the received outputs of the selected necessary ones of said light receiving elements;

an automatic gain control circuit for compensating change of outputs of said switching circuit, which is caused by change in distance between the remote control device and the unit, and for outputting a first signal representing a result of compensation, said automatic gain control circuit outputting a second signal, which represents a quantity of noises generated therein, when said switching circuit receives no outputs of said light receiving elements;

an intensity-of-received-light detecting means for detecting the intensity of light received by each of said light receiving elements from the first signal output by said automatic gain control circuit and for detecting correction data from the second signal output from said automatic gain control circuit;

a position-information generating means for generating position data from the intensities of light detected by said intensity-of-received light detecting means and for outputting the generated position data which indicates what position of said unit said remote control device is turned toward;

a remote-control-code generating means for generating a remote control code corresponding to output data of said position-information generating means and for outputting a signal representing the generated remote code;

a light emitting element for emitting light designating the signal representing the remote control code generated by said remote-control-code generating means, wherein said unit includes:

a light receiving element for receiving the light emitted from said first light emitting element of said remote control device; and a remote-control-code interpreting and discriminating means for interpreting and discriminating the remote control code as represented by the light received by said second light receiving element.

11. A remote control system having a remote control device and a unit to be controlled by said remote control device, said remote control device comprising:

a lens means for limiting the cross section of a beam of light incident thereon to a small area;

at least three light receiving elements for receiving the incident light passing through said lens means, said light receiving elements being arranged such that an area, on which the incident light impinges, of each of said light receiving elements changes depending on an angle of incidence of the incident light;

a switching circuit for receiving outputs of selected necessary ones of said light receiving elements and outputting the received outputs of the selected necessary ones of said light receiving elements;

an automatic gain control circuit for compensating change of outputs of said switching circuit, which is caused by change in distance between the remote control device and the unit, and for outputting a first signal representing a result of compensation, said automatic gain control circuit outputting a second signal, which represents a quantity of noises generated therein, when said switching circuit receives no outputs of said light receiving elements;

an intensity-of-received-light detecting means for detecting the intensity of light received by each of said light receiving elements from the first signal output by said automatic gain control circuit and for detecting correction data from the second signal output from said automatic gain control circuit;

a position-information generating means for generating position data from the intensities of light detected by said intensity-of-received-light detecting means and for outputting the generated position data which indicates what position of said unit said remote control device is turned toward;

a remote-control-code generating means for generating a remote control code corresponding to output data of said position-information generating means and for outputting a signal representing the generated remote code;

a light emitting element for emitting light designating the signal representing the remote control code generated by said remote-control-code generating means, wherein said unit includes:

a light receiving element for receiving the light emitted from said first light emitting element of said remote control device; and a remote-control-circuit interpreting and discriminating means for interpreting and discriminating the remote control code as represented by the light received by said second light receiving element.

* * * * *